United States Patent [19]

Chatterjee

[11] Patent Number: 5,225,702
[45] Date of Patent: Jul. 6, 1993

[54] SILICON CONTROLLED RECTIFIER STRUCTURE FOR ELECTROSTATIC DISCHARGE PROTECTION

[75] Inventor: Amitava Chatterjee, Plano, Tex.

[73] Assignee: Texas Instruments Incorporated, Dallas, Tex.

[21] Appl. No.: 804,271

[22] Filed: Dec. 5, 1991

[51] Int. Cl.$^5$ ............... H01L 29/74; H01L 29/10; H01L 29/06; H02H 9/00
[52] U.S. Cl. .................... 257/360; 257/361; 257/362; 257/363; 257/355; 361/58; 361/56; 361/100; 257/107; 257/110; 257/112
[58] Field of Search .......... 357/38, 23.4, 23.13; 361/56, 58, 100; 257/360, 119, 121, 122, 124, 126, 355, 362, 361, 363

[56] References Cited

U.S. PATENT DOCUMENTS

| | | | |
|---|---|---|---|
| 4,400,711 | 8/1983 | Avery | 357/43 |
| 4,777,518 | 10/1988 | Mihara et al. | 357/23.13 |
| 4,890,187 | 12/1989 | Tailliet et al. | 361/111 |
| 4,896,243 | 1/1990 | Chatterjee et al. | 361/56 |
| 4,939,616 | 7/1990 | Rountree | 361/56 |
| 5,012,317 | 4/1991 | Rountre | 357/38 |
| 5,021,853 | 6/1991 | Mistry | 357/23.13 |
| 5,041,895 | 8/1991 | Contiero et al. | 357/43 |
| 5,072,268 | 12/1991 | Rumennik | 357/23.4 |

OTHER PUBLICATIONS

"A Low-Voltage Triggering SCR for On-Cip ESD Protection at Output and Input Pads", *IEEE Electron Device Letters*, vol. 12, #1, Jan. 1991, Chatterjee et al.

Primary Examiner—Andrew J. James
Assistant Examiner—Valencia M. Martin
Attorney, Agent, or Firm—Chris D. Pylant; Richard A. Stoltz; Richard L. Donaldson

[57] ABSTRACT

A first silicon controlled rectifier structure (220) is provided for electrostatic discharge protection, comprising a lightly doped semiconductor layer (222) having a first conductivity type and a face. A lightly doped region (224) having a second conductivity type opposite the first conductivity type is formed in the semiconductor layer (222) at the face. A first heavily doped region (226) having the second conductivity type is formed laterally within the semiconductor layer (222) at the face and is electrically coupled to a first node (62). A second heavily doped region (230) having the second conductivity type is formed laterally within the lightly doped region (224) and is electrically coupled to a second node (58). A third heavily doped region (228) having the first conductivity type is formed laterally within the lightly doped region (224) to be interposed between the first and second heavily doped regions (226 and 230) and is electrically coupled to the second node (58). A gate insulator region (233) is formed over adjacent regions of the semiconductor layer (222) and of the lightly doped region (224) to be interposed between the first (226) and third (230) heavily doped regions, such that the gate insulator region (233) is formed over a junction (236) between the semiconductor layer (222) and the lightly doped region (224). A polysilicon gate layer (237) is formed over the gate insulator region (233) and is electrically coupled to the first node (62).

30 Claims, 3 Drawing Sheets 5,225,702

SILICON CONTROLLED RECTIFIER STRUCTURE FOR ELECTROSTATIC DISCHARGE PROTECTION

TECHNICAL FIELD OF THE INVENTION

This invention relates in general to electronic circuits, and in particular to silicon controlled rectifier structures for electrostatic discharge protection.

BACKGROUND OF THE INVENTION

Input protection circuitry is an essential part of modern electronic circuits, particularly in the area of field effect transistor based devices. Extremely small delicate device structures are very sensitive to the high voltages which may be developed by an electrostatic discharge ("ESD") from a human body. When an electronic circuit is installed into a product, such an electrostatic discharge may destroy the part or reduce the quality or capacity of the part. These effects may be avoided by providing a means on the electronic circuit for dissipating electrostatic discharges. Complimentary metal oxide semiconductor ("CMOS") field effect transistor circuits are particularly subject to negative consequences of electrostatic discharges. In high density CMOS devices, an electrostatic discharge may develop an extremely high voltage which easily destroys the very thin gate oxides and very short channel devices of these circuits.

To protect CMOS devices against such high voltages, a silicon controlled rectifier ("SCR") structure may be used which is compatible with CMOS processing. Many SCR protection devices have very high threshold trigger voltages, frequently exceeding 50 volts. In many electronic circuits, a 50 volt threshold trigger voltage is insufficient to adequately protect certain devices on the electronic circuit. Some SCR protection devices having lower threshold trigger voltages nevertheless present alternative problems such as lower overall gain and lower maximum current.

Thus, a need has arisen for silicon controlled rectifier structures for electrostatic discharge protection, which are compatible with CMOS processing, which have low threshold trigger voltages, and which avoid presenting alternative problems such as lower overall gain and lower maximum current.

SUMMARY OF THE INVENTION

In a first aspect of the present invention, a silicon controlled rectifier structure for electrostatic discharge protection comprises a lightly doped semiconductor layer having a first conductivity type and a face. A lightly doped region having a second conductivity type opposite the first conductivity type is formed in the semiconductor layer at the face. A first heavily doped region having the second conductivity type is formed laterally within the semiconductor layer at the face and is electrically coupled to a first node. A second heavily doped region having the second conductivity type is formed laterally within the lightly doped region and is electrically coupled to a second node. A third heavily doped region having the first conductivity type is formed laterally within the lightly doped region to be interposed between the first and second heavily doped regions and is electrically coupled to the second node. A gate insulator region is formed over adjacent regions of the semiconductor layer and of the lightly doped region to be interposed between the first and third heavily doped regions, such that the gate insulator region is formed over a junction between the semiconductor layer and the lightly doped region. A polysilicon gate layer is formed over the gate insulator region and is electrically coupled to the first node.

In a second aspect of the present invention, a silicon controlled rectifier structure for electrostatic discharge protection comprises a lightly doped semiconductor layer having a first conductivity type and a face. A lightly doped region having a second conductivity type opposite the first conductivity type is formed in the semiconductor layer at the face. A first heavily doped region having the second conductivity type is formed laterally within the semiconductor layer at the face and is electrically coupled to a first node, wherein the first node is coupled to a first voltage node of an electronic circuit. A second heavily doped region having the second conductivity type is formed laterally within the lightly doped region and is electrically coupled to a second node, wherein the second node is coupled to a second voltage node of the electronic circuit. A third heavily doped region having the first conductivity type is formed laterally within the lightly doped region to be interposed between the first and second heavily doped regions and is electrically coupled to a third node, wherein the third node is coupled to a signal line of the electronic circuit.

It is a technical advantage of the present invention that silicon controlled rectifier structures are provided for electrostatic discharge protection, which are compatible with CMOS processing.

It is another technical advantage of the present invention that silicon controlled rectifier structures are provided for electrostatic discharge protection, which have low threshold trigger voltages.

It is a further technical advantage of the present invention that silicon controlled rectifier structures are provided for electrostatic discharge protection, which avoid presenting alternative problems such as lower overall gain and lower maximum current.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

The preferred embodiment of the present invention and its advantages are best understood by referring to FIGS. 1 through 11 of the drawings, like numerals being used for like and corresponding parts of the various drawings.

Figure 1:
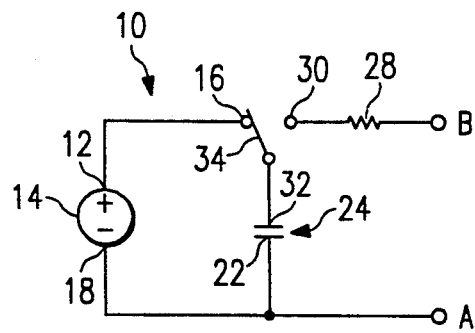
FIG. 1 is a schematic electrical circuit diagram of a model of electrostatic discharge from a human body.

FIG. 1 is a schematic electrical circuit diagram 10 of a model of an electrostatic discharge from a human body. A positive terminal 12 of a voltage source 14 is connected to a node 16. A negative terminal 18 of voltage source 14 is connected to a first electrode 22 of a capacitor 24 and to a Node A. A Node B is connected through a resistor 28 to a node 30. A second electrode 32 of capacitor 24 is connected to a switch 34, which selectively couples electrode 32 of capacitor 24 either to node 16 or to node 30.

In a model of electrostatic discharge from a human body, resistor 28 has a value of approximately 1.5 kiloohms, and capacitor 24 has a value of approximately 100 picofarads. A voltage at voltage source 14 is variable, but typically ranges from approximately 1,000 volts to over 4,000 volts. In a typical test of a device's sensitivity to electrostatic discharge, Node B is connected to an output signal pad of the device, and Node A is connected to a $V_{ss}$ pad of the device; during the test, all other pads of the device are floating. In performing such a test, switch 34 initially couples node 16 to electrode 32 of capacitor 24, so that capacitor 24 charges to the voltage of voltage source 14. After capacitor 24 is charged to the voltage of voltage source 14, switch 34 couples node 30 to electrode 32 of capacitor 24, such that node 16 is no longer connected to electrode 32 of capacitor 24. Capacitor 24 then discharges and supplies a current to a device connected between Node A and Node B. In the model of electrostatic discharge from a human body, a voltage at voltage source 14 of approximately 4,000 volts is comparable to a spark that sometimes occurs when a human body touches a door knob. If the device connected between Node A and Node B successfully withstands an electrostatic discharge of at least 4,000 volts, then the device is relatively insensitive to electrostatic discharge; if the device fails to successfully withstand an electrostatic discharge of at least 4,000 volts, then the device is typically classified as being sensitive to electrostatic discharge. If a voltage at voltage source 14 is approximately 4,000 volts, then an initial current discharge from capacitor 24 through resistor 28 may be as high as approximately 2.6 amperes, depending upon an impedance of the device connected between Node A and Node B.

Figure 2:
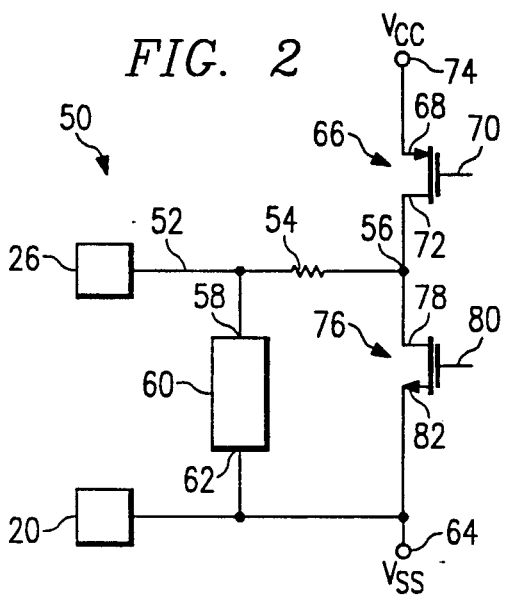
FIG. 2 is a schematic electrical circuit diagram of circuitry for electrostatic discharge protection at an output signal line of an electronic circuit.

FIG. 2 is a schematic electrical circuit diagram of circuitry, indicated generally at 50, for electrostatic discharge protection at an output signal line 52 of an electronic circuit. Output signal pad 26 is connected to output signal line 52, which is connected through resistor 54 to an output signal node 56. Output signal line 52 is further connected to an anode 58 of an electrostatic discharge protection device 60. A cathode 62 of electrostatic discharge protection device 60 is connected to $V_{ss}$ pad 20, which is connected to a voltage reference node $V_{ss}$ 64. P-channel output transistor 66 has a source 68, a gate 70, and a drain 72. Source 68 of output transistor 66 is connected to a voltage supply node $V_{cc}$ 74, and drain 72 of output transistor 66 is connected to output signal node 56. Under normal operating conditions, a DC voltage source is coupled between the $V_{cc}$ and $V_{ss}$ voltage nodes, such that the voltage potential at $V_{cc}$ is substantially higher than at $V_{ss}$, in order to allow operation of transistors 66 and 76. An n-channel output transistor 76 has a drain 78, a gate 80, and a source 82. Gate 78 of output transistor 76 is connected to output signal node 56, and source 82 of output transistor 76 is connected to $V_{ss}$ node 64. Output transistors 66 and 76 together form a typical CMOS output buffer of an electronic circuit. Preferably, electrostatic discharge protection device 60 is integral with an electronic circuit whose sensitivity to electrostatic discharge is tested. In an alternative embodiment, electrostatic discharge protection device 60 may be coupled to an input signal line of an electronic circuit, rather than to an output signal line.

N-channel output transistor 76 typically has a gate oxide thickness of approximately 200 Angstroms and has a channel length of approximately 0.8 micrometers. An oxide breakdown voltage for such an output transistor 76 is approximately 20-25 volts. When a high voltage is applied to output signal pad 26 relative to $V_{ss}$ pad 20, output transistor 76 clamps a voltage of approximately 15 volts between its drain 78 and source 82, primarily depending upon a gate oxide thickness of output transistor 76. Despite the ability of output transistor 76 to clamp approximately 15 volts, a sufficiently large current through output transistor 76 may cause output transistor 76 to fail; in some cases, a typical output transistor 76 fails if it conducts current of approximately one ampere.

Electrostatic discharge protection device 60 provides an additional current path between output signal pad 26 and $V_{ss}$ pad 20 in order to diminish a current through output transistor 76 so that a failure of output transistor 76 may be avoided. After a flow of current through electrostatic discharge protection device 60 is initiated between anode 58 and cathode 62, a voltage between anode 58 and cathode 62 necessary to sustain the flow of current through electrostatic discharge protection device 60 is only approximately 2.5 volts. Nevertheless, in order to initiate the flow of current through electrostatic discharge protection device 60, a trigger voltage of approximately 50 volts is typically required between anode 58 and cathode 62, such that resistor 54 is necessary. By including resistor 54, a voltage between anode 58 and cathode 62 of electrostatic discharge protection device 60 comprises a voltage across resistor 54 together with a voltage between drain 78 and source 82 of output transistor 76. Since a typical output transistor 76 clamps a voltage of only approximately 15 volts, a voltage across resistor 54 must be at least approximately 35 volts in order to provide a total of 50 volts between anode 58 and cathode 62 of electrostatic discharge protection device 60 sufficient to initiate a flow of current through electrostatic discharge protection device 60. If a current through resistor 54 is 0.5 amperes, then resistor 54 must have a value of approximately 70 ohms in order to provide a voltage across resistor 54 of at least 35 volts.

It is undesirable for resistor 54 to have a resistance as high as 70 ohms, because such a high resistance interferes with normal operation of output signal line 52. In particular, it is desirable for output signal line 52 to have a low impedance, because an external device typically draws current from output signal line 52 during normal operation. Consequently, if output signal line 52 has a high impedance, then the level of current available through output signal line 52 is limited, because a voltage drop across such a high impedance conflicts with a proper maintenance of appropriate digital logic voltage levels at output signal pad 26. Thus, as a value of resistor 54 increases, a current available through output signal line 52 must usually decrease in order to properly maintain appropriate digital logic voltage levels at output signal pad 26. A lower current through output signal line 52 undesirably slows a charging of a capacitive load (not shown) connected between output signal pad 26 and $V_{ss}$ pad 20. Also, as a value of resistor 54 increases, an RC time constant increases, which may undesirably slow switching times of an external device connected between output signal pad 26 and $V_{ss}$ pad 20. Therefore, it is desirable to reduce the trigger voltage of electrostatic discharge protection device 60, so that the resistance of resistor 54 may be minimized.

Figure 3:
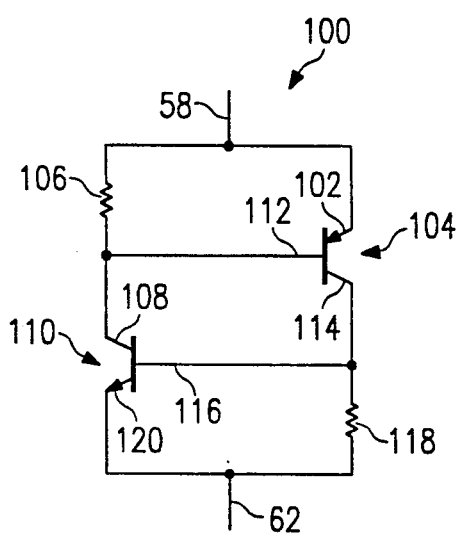
FIG. 3 is a schematic electrical circuit diagram of a first type of SCR for electrostatic discharge protection.

FIG. 3 is a schematic electrical circuit diagram of a first type of SCR, indicated generally at 100, for electrostatic discharge protection. SCR 100 may be used as electrostatic discharge protection device 60 of FIG. 2. Thus, anode 58 is connected to output signal line 52 of FIG. 2, and cathode 62 is connected to $V_{ss}$ pad 20 of FIG. 2. In FIG. 3, anode 58 is connected to an emitter 102 of a pnp bipolar transistor 104. Anode 58 is further connected through a resistor 106 to a collector 108 of an npn bipolar transistor 110 and to a base 112 of transistor 104. Bipolar transistors 104 and 110 are compatible with CMOS processing. A collector 114 of transistor 104 is connected to a base 116 of transistor 110. Base 116 of transistor 110 is further connected through a resistor 118 to cathode 62 and to an emitter 120 of transistor 110.

When a voltage at anode 58 is positive relative to a voltage at cathode 62, the base-collector junctions of transistors 104 and 110 are reverse biased. In typical previous approaches, a voltage at anode 58 must be at least approximately 50 volts, relative to a voltage at cathode 62, in order to turn on transistors 104 and 110 by creating an avalanche production of carriers at the base-collector junctions of transistors 104 and 110. After transistors 104 and 110 are turned on, SCR 100 remains highly conductive, because the base-emitter junctions of transistors 104 and 100 are forward biased, such that resistor 106 and transistor 110 provide a bias voltage and a bias current at base 112 of transistor 104, and such that resistor 118 and transistor 104 provide a bias voltage and a bias current at base 116 of transistor 110. Typically, SCR 100 remains highly conductive so long as a voltage at anode 58 is at least approximately 2.5 volts higher than a voltage at cathode 62. In this manner, SCR 100 quickly dissipates charge between anode 58 and cathode 62. If currents through resistors 106 and 118 are ever insufficient to forward bias transistors 104 and 110, respectively, then transistors 104 and 110 turn off, such that SCR 100 returns to a nonconductive state.

Figure 4:
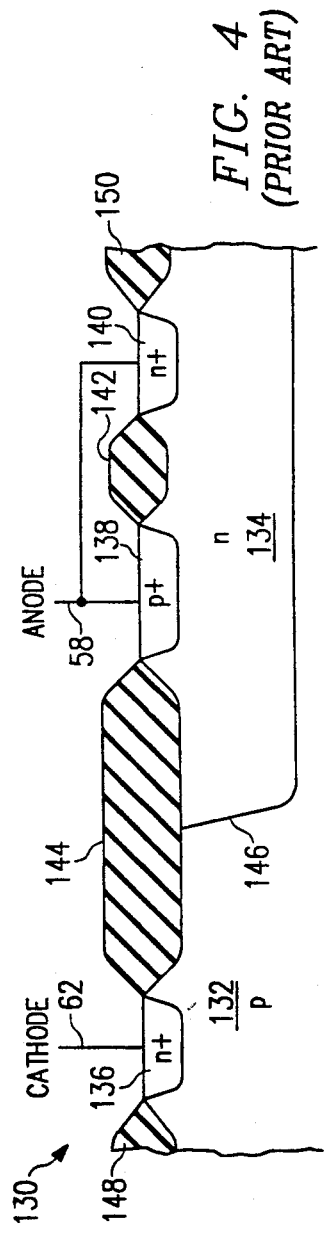
FIG. 4 is a highly magnified schematic sectional view of a first prior art SCR structure for electrostatic discharge protection having the electrical characteristics illustrated in FIG. 3.

FIG. 4 is a highly magnified schematic sectional view of a first prior art SCR structure, indicated generally at 130, for electrostatic discharge protection having the electrical characteristics illustrated in FIG. 3. SCR structure 130 is typically referred to as a lateral SCR ("LSCR") structure. SCR structure 130 is formed in a lightly doped P type semiconductor layer 132 which is electrically contacted to cathode 62. A lightly doped N well 134 is formed in P semiconductor layer 132 An N+ region 136 is formed in P semiconductor layer 132 and is electrically contacted to cathode 62. A P+ region 138 and an N+ region 140 are formed in N well 134 and are electrically contacted to anode 58. In FIGS. 4-8 and 10-11, electrical contacts to semiconductor regions are shown only schematically for clarity. A field oxide region 142 is formed in N well 134, such that field oxide region 142 is interposed between P+ region 138 and N+ region 140. A field oxide region 144 is formed in P semiconductor layer 132 and in N well 134, such that field oxide region 144 is interposed between N+ region 136 and P+ region 138, and such that field oxide region 144 overlaps a junction 146 between P semiconductor layer 132 and N well 134. Field oxide regions 148 and 150 isolate SCR structure 130 from laterally adjacent structures on an integrated circuit.

With reference to FIG. 3 and FIG. 4, emitter 120 of transistor 110 is provided by N+ region 136, base 116 of transistor 110 is provided by P semiconductor layer 132, and collector 108 of transistor 110 is provided by N well 134. Collector 114 of transistor 104 is provided by P semiconductor layer 132, base 112 of transistor 104 is provided by N well 134, and emitter 102 of transistor 104 is provided by P+ region 138. Resistor 106 of FIG. 3 is provided by inherent resistance through N well 134, and resistor 118 of FIG. 3 is provided inherent resistance through P semiconductor layer 132.

When a voltage at anode 58 is less than approximately 50 volts relative to a voltage at cathode 62, the junction 146 between N well 134 and P semiconductor layer 132 is reverse biased, such that very little current is conducted by SCR structure 130. In FIG. 4, a voltage at anode 58 must be at least approximately 50 volts, relative to a voltage at cathode 62, in order to create avalanche production of carriers at the junction between N well 134 and P semiconductor layer 132.

Figure 5:
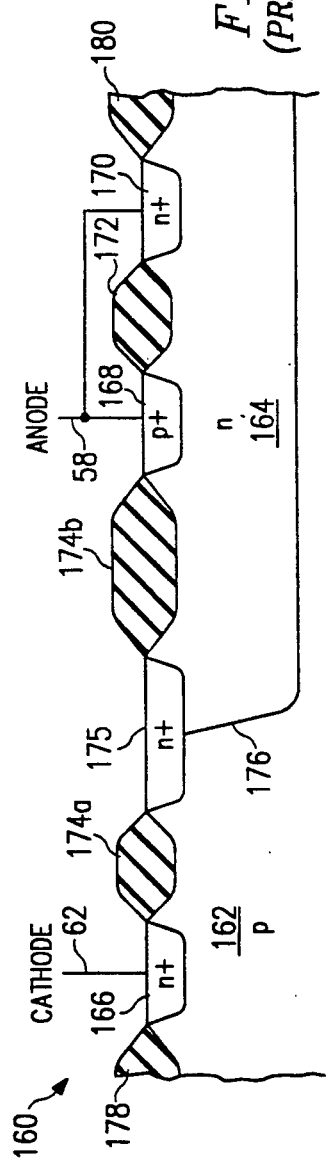
FIG. 5 is a highly magnified schematic sectional view of a second prior art SCR structure for electrostatic discharge protection having the electrical characteristics illustrated in FIG. 3.

FIG. 5 is a highly magnified schematic sectional view of a second prior art SCR structure, indicated generally at 160, for electrostatic discharge protection having the electrical characteristics illustrated in FIG. 3. SCR structure 160 is typically referred to as a modified lateral SCR ("MLSCR") structure. SCR structure 160 is formed in a lightly doped P type semiconductor layer 162 which is electrically contacted to cathode 62. A lightly doped N well 164 is formed in P semiconductor layer 162. An N+ region 166 is formed in P semiconductor layer 162 and is electrically contacted to cathode 62. A P+ region 168 and an N+ region 170 are formed in N well 164 and are electrically contacted to anode 58. A field oxide region 172 is formed in N well 164, such that field oxide region 172 is interposed between P+ region 168 and N+ region 170. A field oxide region 174a is formed in P semiconductor layer 162, such that field oxide region 174a is interposed between N+ region 166 and an N+ region 175. N+ region 175 is formed in P semiconductor layer 162 and in N well 164, such that N+ region 175 overlaps a junction 176 between P semiconductor layer 162 and N well 164. A field oxide region 174b is formed in N well 164, such that field oxide region 174b is interposed between P+ region 168 and N+ region 175. Field oxide regions 178 and 180 isolate SCR structure 160 from laterally adjacent structures on an integrated circuit.

With reference to FIG. 3 and FIG. 5, emitter 120 of transistor 110 is provided by N+ region 166, base 116 of transistor 110 is provided by P semiconductor layer 162, and collector 108 of transistor 110 is provided by N well 164. Collector 114 of transistor 104 is provided by p semiconductor layer 162, base 112 of transistor 104 is provided by N well 164, and emitter 102 of transistor 104 is provided by P+ region 168. Resistor 106 of FIG. 3 is provided by inherent resistance through N well 164, and resistor 118 of FIG. 3 is provided inherent resistance through P semiconductor layer 162.

When used as electrostatic discharge protection device 60 of FIG. 2, SCR structure 160 of FIG. 5 provides a low trigger voltage relative to SCR structure 130 of FIG. 4, because an electric field between heavily doped N+ region 175 and P semiconductor layer 162 is higher than an electric field between lightly doped N well 164 and P semiconductor layer 162. Such a higher electric field is created because the voltage between anode 58 and cathode 62 drops across a shorter distance corresponding to a smaller depletion layer width at the junction between heavily doped N+ region 175 and P semiconductor layer 162. Consequently, an avalanche production of carriers may be created between heavily doped N+ region 175 and P semiconductor layer 162 more easily than between lightly doped N well 164 and P semiconductor layer 162. Since base 116 of transistor 110 is provided by p semiconductor layer 162, an avalanche production of carriers between heavily doped N+ region 175 and P semiconductor layer 162 provides a bias current to base 116 of transistor 110, thereby substantially turning on transistor 110 and consequently turning on transistor 104 to initiate a flow of current through electrostatic discharge protection device 60 between anode 58 and cathode 62.

Nevertheless, a shortcoming of SCR structure 160 of FIG. 5 is that heavily doped N+ region 175 results in a higher concentration of electrons near base 112 of transistor 104, such that an electric field around N+region 175 retards a lateral current flow of holes and hence decreases the gain of transistor 104. By decreasing the gain of transistor 104, the overall gain of SCR structure 160 is decreased relative to SCR structure 130 of FIG. 4, and transistor 104 presents a higher impedance. When transistor 104 presents a higher impedance, a greater voltage is required to maintain current flow through transistor 104, thereby making SCR structure 160 less effective because it is more difficult to latch. Moreover, N+ region 175 increases a spacing between cathode 62 and anode 58, which makes SCR structure 160 even more difficult to latch relative to SCR structure 130 of FIG. 4, particularly for thin epitaxial grounded substrate technologies having a lightly doped P epitaxial layer formed over a heavily doped P+ substrate.

Figure 6:
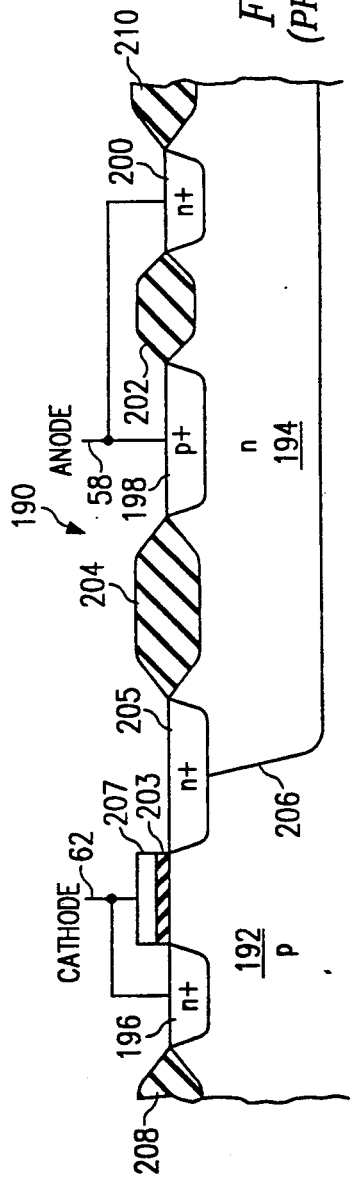
FIG. 6 is a highly magnified schematic sectional view of a third prior art SCR structure for electrostatic discharge protection having the electrical characteristics illustrated in FIG. 3.

FIG. 6 is a highly magnified schematic sectional view of a third prior art SCR structure, indicated generally at 190, for electrostatic discharge protection having the electrical characteristics illustrated in FIG. 3. SCR structure 190 is typically referred to as a low voltage triggering SCR ("LVTSCR") structure. SCR structure 190 is formed in a lightly doped P type semiconductor layer 192 which is electrically contacted to cathode 62. A lightly doped N well 194 is formed in P semiconductor layer 192. An N+ region 196 is formed in P semiconductor layer 192 and is electrically contacted to cathode 62. A P+ region 198 and an N+ region 200 are formed in N well 194 and are electrically contacted to anode 58. A field oxide region 202 is formed in N well 194, such that field oxide region 202 is interposed between P+ region 198 and N+ region 200. A thin gate oxide region 203 is formed over a region of P semiconductor layer 192 which is interposed between N+region 196 and an N+ region 205. N+ region 205 is formed in P semiconductor layer 192 and in N well 194, such that N+ region 205 overlaps a junction 206 between P semiconductor layer 192 and N well 194. A polysilicon gate layer 207 is formed over gate oxide region 203 and is electrically contacted to cathode 62. A field oxide region 204 is formed in N well 194, such that field oxide region 204 is interposed between P+ region 198 and N+ region 205. Field oxide regions 208 and 210 isolate SCR structure 190 from laterally adjacent structures on an integrated circuit.

With reference to FIG. 3 and FIG. 6, emitter 120 of transistor 110 is provided by N+ region 196, base 116 of transistor 110 is provided by P semiconductor layer 192, and collector 108 of transistor 110 is provided by N well 194. Collector 114 of transistor 104 is provided by P semiconductor layer 192, base 112 of transistor 104 is provided by N well 194, and emitter 102 of transistor 104 is provided by P+ region 198. Resistor 106 of FIG. 3 is provided by inherent resistance through N well 194, and resistor 118 of FIG. 3 is provided inherent resistance through P semiconductor layer 192.

Similar to SCR structure 160 of FIG. 5, SCR structure 190 of FIG. 6 provides a very low trigger voltage, because an electric field between heavily doped N+ region 205 and P semiconductor layer 192 is higher than an electric field between lightly doped N well 194 and P semiconductor layer 192, such that an avalanche production of carriers may be created between heavily doped N+ region 205 and P semiconductor layer 192 more easily than between lightly doped N well 194 and P semiconductor layer 192. Since base 116 of transistor 110 is provided by P semiconductor layer 192, an avalanche production of carriers between heavily doped N+ region 205 and P semiconductor layer 192 provides a bias current to base 116 of transistor 110, thereby substantially turning on transistor 110 and consequently turning on transistor 104 to initiate a flow of current through electrostatic discharge protection device 60 between anode 58 and cathode 62.

Moreover, a trigger voltage of SCR structure 190 of FIG. 6 is even lower than a trigger voltage of SCR structure 160 of FIG. 5, because a higher electric field is created across junction 206 between N well 194 and P semiconductor layer 192 when a voltage at anode 58 is positive relative to a voltage at cathode 62, because the voltage potential between anode 58 and cathode 62 drops across a smaller distance as applied by polysilicon gate layer 207 across thin gate oxide region 203 more proximate to the junction 206 between N well 194 and P semiconductor layer 192. This approach of SCR structure 190 of FIG. 6 is different from the approach of SCR structure 130 of FIG. 4 and from the approach of SCR structure 160 of FIG. 5, in which the voltage potential between anode 58 and cathode 62 drops across a greater distance corresponding to the width of the depletion layer at the junction between the N well and the P semiconductor layer. Furthermore, the vertical component of the electric field is very small in SCR structure 130 of FIG. 4 and in SCR structure 160 of FIG. 5, relative to the vertical component of the electric field in SCR structure 190 of FIG. 6.

Nevertheless, SCR structure 190 of FIG. 6 has all the shortcomings of SCR structure 160 of FIG. 5. Moreover, SCR structure 190 of FIG. 6 has an additional shortcoming, in that a flow of current through transistor 110 is primarily concentrated through a small channel formed in P semiconductor layer 192 between N+ region 205 and N+ region 196. Consequently, heat is primarily concentrated in a smaller volume, thus decreasing a maximum current possible through transistor 110 while avoiding a failure of SCR structure 190.

Figure 7:
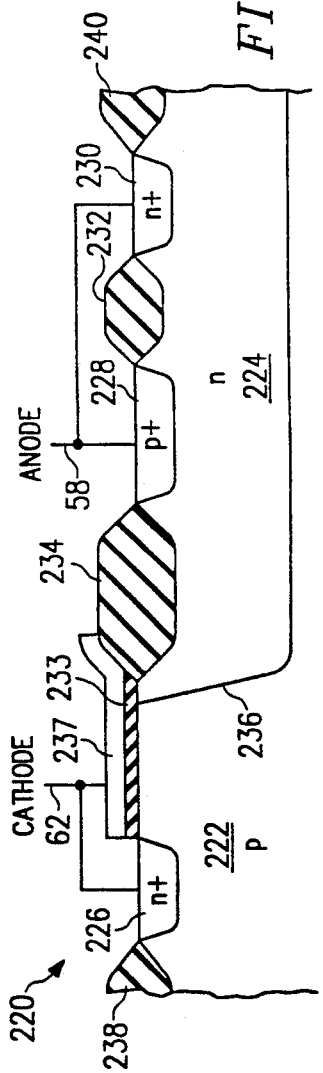
FIG. 7 is a highly magnified schematic sectional view of an SCR structure for electrostatic discharge protection, according to a first illustrative embodiment of the present invention.

FIG. 7 is a highly magnified schematic sectional view of an SCR structure, indicated generally at 220, for electrostatic discharge protection, according to a first illustrative embodiment of the present invention. SCR structure 220 may be referred to as a gated SCR structure. SCR structure 220 may be formed by growing a lightly doped P type epitaxial semiconductor layer 222 over a heavily doped P+ substrate (not shown). After appropriate patterning with a photoresist layer (not shown), a lightly doped N well 224 is implanted in P semiconductor layer 222. After implanting N well 224 and stripping the photoresist layer, a hard mask oxide (not shown) is deposited, patterned and etched to define regions in which to grow thick LOCOS field silicon dioxide ("field oxide") regions 232, 234, 238 and 240. After growing field oxide regions 232, 234, 238 and 240, and stripping the hard mask oxide, a gate oxide region 233 is grown. Other suitable types of insulators may be alternatively substituted in place of one or more oxide regions. After growing gate oxide region 233, a polysilicon layer is deposited, patterned and etched to form a polysilicon gate layer 237. An N+ region 226 is then patterned and formed in P semiconductor layer 222, self-aligned to field oxide region 238 and gate oxide region 233; similarly, an N+ region 230 is patterned and formed in N well 224, self-aligned to field oxide regions 232 and 240; likewise, a P+ region 228 is patterned and formed in N well 224, self-aligned to field oxide regions 232 and 234.

P semiconductor layer 222 is electrically contacted to cathode 62. N+ region 226 is electrically contacted to cathode 62. P+ region 228 and N+ region 230 are electrically contacted to anode 58. Field oxide region 232 is interposed between P+ region 228 and N+ region 230. Thin gate oxide region 233 is formed over regions of P semiconductor layer 222 and of N well 224 which are interposed between N+ region 226 and P+ region 228, such that gate oxide region 233 is formed over a junction 236 between P semiconductor layer 222 and N well 224. Polysilicon gate layer 237 is electrically contacted to cathode 62. Field oxide region 234 is interposed between gate oxide region 233 and P+ region 228. Polysilicon gate layer 237 extends over substantially all of gate oxide region 233 and over a portion of field oxide region 234. A sectional length of field oxide region 234 extending from gate oxide region 233 to P+ region 228 is approximately 1.5 micrometers. A section of gate oxide region 233 which overlays N well 224 has a sectional length of approximately 0.5 micrometers. Field oxide regions 238 and 240 isolate SCR structure 220 from laterally adjacent structures on an integrated circuit.

With reference to FIG. 3 and FIG. 7, emitter 120 of transistor 110 is provided by N+ region 226, base 116 of transistor 110 is provided by P semiconductor layer 222, and collector 108 of transistor 110 is provided by N well 224. Collector 114 of transistor 104 is provided by P semiconductor layer 222, base 112 of transistor 104 is provided by N well 224, and emitter 102 of transistor 104 is provided by P+ region 228. Resistor 106 of FIG. 3 is provided by inherent resistance through N well 224, and resistor 118 of FIG. 3 is provided inherent resistance through P semiconductor layer 222. In FIG. 7, polysilicon gate layer 237 may be conceptually viewed as a gate of an n-channel transistor, with a drain of the n-channel transistor being provided by N well 224 and a source of the n-channel transistor being provided by N+ region 226.

In FIG. 7, SCR structure 220 provides the technical advantage that a higher electric field is created across junction 236 between N well 224 and P semiconductor layer 222 when a voltage at anode 58 is positive relative to a voltage at cathode 62, because the voltage potential between anode 58 and cathode 62 drops across a smaller distance as applied by polysilicon gate layer 237 across thin gate oxide region 233 more proximate to the junction 236 between N well 224 and P semiconductor layer 222. This approach of SCR structure 220 of FIG. 7 is different from the approach of SCR structure 130 of FIG. 4 and from the approach of SCR structure 160 of FIG. 5, in which the voltage potential between anode 58 and cathode 62 drops across a greater distance corresponding to the width of the depletion layer at the junction between the N well and the P semiconductor layer. Furthermore, the vertical component of the electric field is very small in SCR structure 130 of FIG. 4 and in SCR structure 160 of FIG. 5, relative to the vertical component of the electric field in SCR structure 220 of FIG. 7.

In FIG. 7, by advantageously creating a higher electric field across junction 236, a voltage at anode 58 of only approximately 25 volts, relative to a voltage at cathode 62, is sufficient to create an avalanche production of carriers at the junction 236 between N well 224 and P semiconductor layer 222 of FIG. 7, thereby reducing a trigger voltage of electrostatic discharge protection device 60 of FIG. 2. Using SCR structure 220 of FIG. 7, a voltage across resistor 54 may be approximately 10 volts in order to provide a total of 25 volts between anode 58 and cathode 62 of electrostatic discharge protection device 60 sufficient to initiate a flow of current through electrostatic discharge protection device 60, since a typical output transistor 76 clamps a voltage of approximately 15 volts. If a current through resistor 54 is 0.5 amperes, then resistor 54 may have a value of approximately 20 ohms in order to provide a voltage across resistor 54 of at least 10 volts, in contrast to a value of approximately 70 ohms in order to provide a voltage across resistor 54 of at least 35 volts when a trigger voltage of approximately 50 is required between anode 58 and cathode 62.

SCR structure 220 of FIG. 7 substantially avoids the shortcomings of SCR structure 160 of FIG. 5 and of SCR structure 190 of FIG. 6. By eliminating an N+ region which would otherwise overlap the junction 236 between P semiconductor layer 222 and N well 224, SCR structure 220 of FIG. 7 achieves a higher overall gain than the SCR structures of FIGS. 5 and 6, because an electric field around the N+ region no longer retards a lateral current flow of holes. Also, SCR structure 220 of FIG. 7 is easier to latch, because it reduces the spacing between cathode 62 and anode 58. Moreover, SCR structure 220 achieves a higher maximum current than SCR structure 190 of FIG. 6, because a flow of current through transistor 110 is not primarily concentrated through a small channel.

Figure 8:
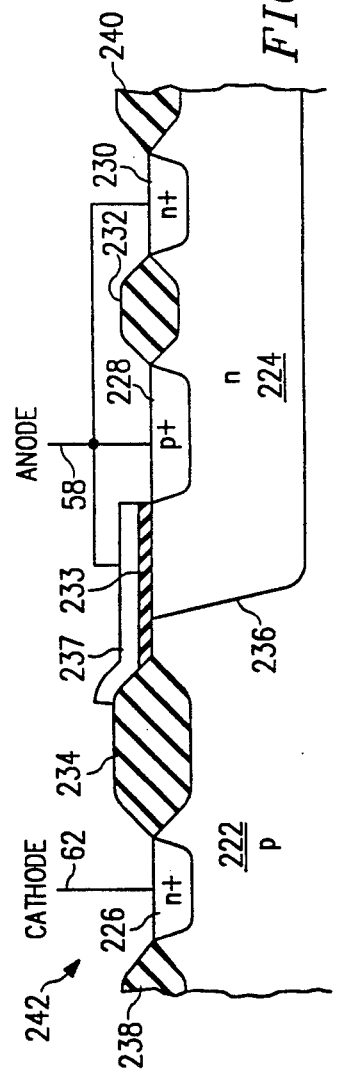
FIG. 8 is a highly magnified schematic sectional view of an SCR structure for electrostatic discharge protection, according to a second illustrative embodiment of the present invention.

FIG. 8 is a highly magnified schematic sectional view of an SCR structure, indicated generally at 242, for electrostatic discharge protection, according to a second illustrative embodiment of the present invention. SCR structure 242 of FIG. 8 is essentially an alternative embodiment of SCR structure 220 of FIG. 7. In this alternative embodiment, polysilicon gate layer 237 of FIG. 7 is electrically contacted to anode 58 instead of cathode 62. Thus, in FIG. 8, field oxide region 234 of FIG. 7 is formed in P semiconductor layer 222 instead of N well 224, such that field oxide region 234 is interposed between gate oxide region 233 and N+ region 226 instead of between gate oxide region 233 and P+ region 228. In FIG. 8, a sectional length of field oxide region 234 extending from N+ region 226 to gate oxide region 233 is approximately 1.5 micrometers, and a section of gate oxide region 233 which overlays P semiconductor layer 222 has a sectional length of approximately 0.5 micrometers. Also, in FIG. 8, polysilicon gate layer 237 may be conceptually viewed as a gate of an p-channel transistor, with a drain of the p-channel transistor being provided by P semiconductor layer 222 and a source of the p-channel transistor being provided by P+ region 228.

The technical advantages of SCR structure 242 of FIG. 8 are substantially equivalent to those of SCR structure 220 of FIG. 7.

Figure 9:
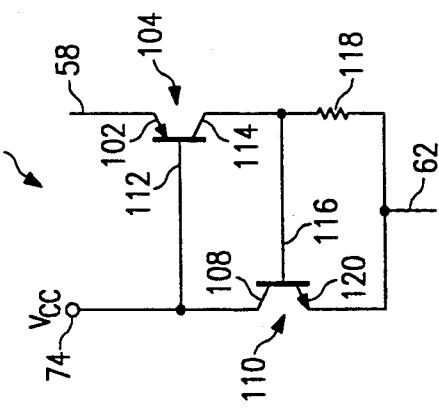
FIG. 9 is a schematic electrical circuit diagram of a second type of SCR for electrostatic discharge protection.

FIG. 9 is a schematic electrical circuit diagram of a second type of SCR, indicated generally at 300, for electrostatic discharge protection. FIG. 9 is identical in all respects to FIG. 3, except that emitter 102 of transistor 104 is connected only to anode 58, and except that base 112 of transistor 104 and collector 108 of transistor 110 are connected only to $V_{cc}$ node 74 without resistor 106.

In a typical test of a device's sensitivity to electrostatic discharge, $V_{cc}$ 74 is floating. During such a test involving SCR 300 of FIG. 9, a relatively low threshold voltage between base 112 and emitter 102 of transistor 104 may initiate a flow of current through transistor 104. After transistor 104 is substantially turned on, resistor 118 and transistor 104 provide a bias voltage and a bias current at base 116 of transistor 110, thereby turning on transistor 110 and initiating a flow of current through electrostatic discharge protection device 60 between anode 58 and cathode 62.

Figure 10:
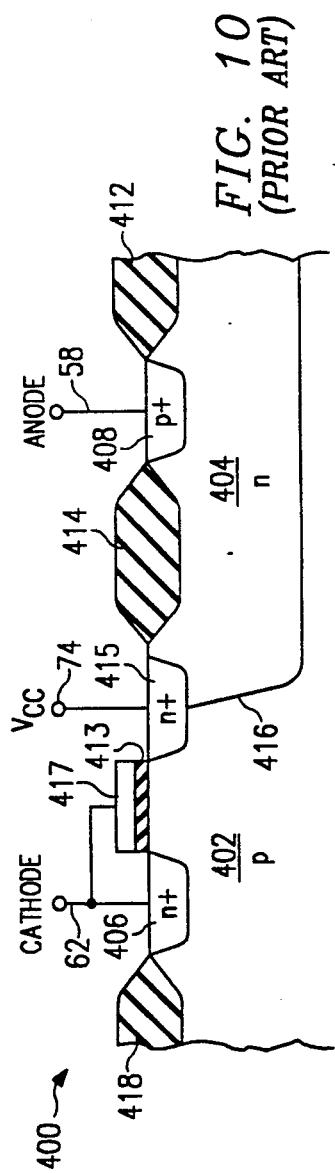
FIG. 10 is a highly magnified schematic sectional view of a prior art SCR structure for electrostatic discharge protection having the electrical characteristics illustrated in FIG. 9.

FIG. 10 is a highly magnified schematic sectional view of a prior art SCR structure, indicated generally at 400, for electrostatic discharge protection having the electrical characteristics illustrated in FIG. 9. SCR structure 400 is formed in a lightly doped P type semiconductor layer 402 which is electrically contacted to cathode 62. A lightly doped N well 404 is formed in P semiconductor layer 402. An N+ region 406 is formed in P semiconductor layer 402 and is electrically contacted to cathode 62. A P+ region 408 is formed in N well 404 and is electrically contacted to anode 58. A thin gate oxide region 413 is formed over a region of P semiconductor layer 402 which is interposed between N+ region 406 and an N+ region 415. N+ region 415 is formed in P semiconductor layer 402 and in N well 404, such that N+ region 415 overlaps a junction 416 between P semiconductor layer 402 and N well 404. N+ region 415 is electrically contacted to $V_{cc}$ node 74 of FIG. 9. A polysilicon gate layer 417 is formed over gate oxide region 413 and is electrically contacted to cathode 62. A field oxide region 414 is formed in N well 404, such that field oxide region 414 is interposed between P+ region 408 and N+ region 415. Field oxide regions 418 and 412 isolate SCR structure 400 from laterally adjacent structures on an integrated circuit.

With reference to FIG. 9 and FIG. 10, emitter 120 of transistor 110 is provided by N+ region 406, base 116 of transistor 110 is provided by P semiconductor layer 402, and collector 108 of transistor 110 is provided by N well 404. Collector 114 of transistor 104 is provided by P semiconductor layer 402, base 112 of transistor 104 is provided by N well 404, and emitter 102 of transistor 104 is provided by P+ region 408. Resistor 118 of FIG. 9 is provided inherent resistance through P semiconductor layer 402.

SCR structure 400 of FIG. 10 has all the shortcomings described hereinabove in connection with SCR structure 160 of FIG. 5 and with SCR structure 190 of FIG. 6. A further shortcoming of SCR structure 400 is that the current path between $V_{cc}$ 74 and P semiconductor layer 402 substantially avoids a resistance through N well 404, so that a larger fraction of the total current discharge flows in a small channel formed in P semiconductor layer 402 between N+ region 415 and N+ region 406, resulting in failure at a lower current discharge level such that a maximum current discharge level is reduced.

Figure 11:
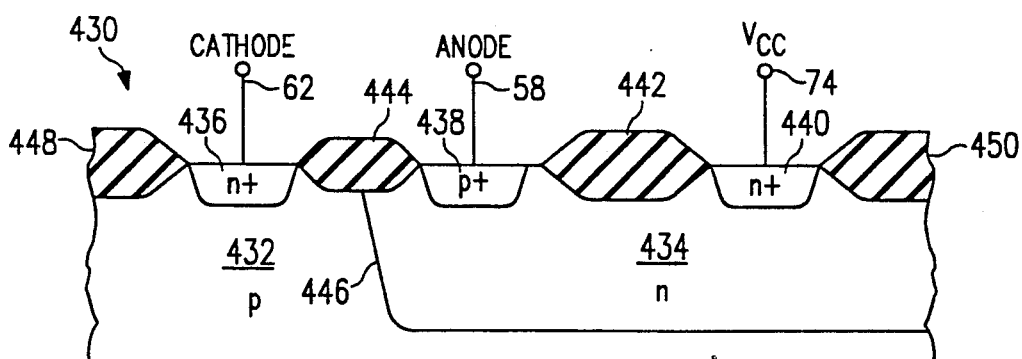
FIG. 11 is a highly magnified schematic sectional view of an SCR structure for electrostatic discharge protection, according to a third illustrative embodiment of the present invention.

FIG. 11 is a highly magnified schematic sectional view of an SCR structure, indicated generally at 430, for electrostatic discharge protection, according to a third illustrative embodiment of the present invention. SCR structure 430 may be formed by growing a lightly doped P type epitaxial semiconductor layer 432 over a heavily doped P+ substrate (not shown). After appropriate patterning with a photoresist layer (not shown), a lightly doped N well 434 is implanted in P semiconductor layer 432. After implanting N well 434 and stripping the photoresist layer, a hard mask oxide (not shown) is deposited, patterned and etched to define regions in which to grow thick LOCOS field oxide regions 442, 444, 448 and 450. Other suitable types of insulators may be alternatively substituted in place of one or more oxide regions. After growing field oxide regions 442, 444, 448 and 450, and stripping the hard mask oxide, an N+ region 436 is patterned and formed in P semiconductor layer 432, self-aligned to field oxide regions 448 and 444; similarly, an N+ region 440 is patterned and formed in N well 434, self-aligned to field oxide regions 442 and 450; likewise, a P+ region 438 is patterned and formed in N well 434, self-aligned to field oxide regions 442 and 444.

P semiconductor layer 432 is electrically contacted to cathode 62. N+ region 436 is electrically contacted to cathode 62. P+ region 438 is electrically contacted to anode 58, and N+ region 440 is electrically contacted to $V_{cc}$ node 74 of FIG. 9. Field oxide region 442 is interposed between P+ region 438 and N+ region 440. Field oxide region 444 is interposed between N+ region 436 and P+ region 438, such that field oxide region 444 overlaps a junction 446 between P semiconductor layer 432 and N well 434. Field oxide regions 448 and 450 isolate SCR structure 430 from laterally adjacent structures on an integrated circuit.

With reference to FIG. 9 and FIG. 11, emitter 120 of transistor 110 is provided by N+ region 436, base 116 of transistor 110 is provided by P semiconductor layer 432, and collector 108 of transistor 110 is provided by N well 434. Collector 114 of transistor 104 is provided by P semiconductor layer 432, base 112 of transistor 104 is provided by N well 434, and emitter 102 of transistor 104 is provided by P+ region 438. Resistor 118 of FIG. 9 is provided inherent resistance through P semiconductor layer 432. Moreover, the current path between $V_{cc}$ 74 and P semiconductor layer 432 includes a resistance through N well 434.

SCR structure 430 of FIG. 11 substantially avoids the shortcomings of SCR structure 400 of FIG. 10. By eliminating an N+ region which would otherwise overlap the junction 446 between P semiconductor layer 432 and N well 434, SCR structure 430 of FIG. 11 achieves a higher overall gain than SCR structure 400 of FIG. 10, because an electric field around the N+ region no longer retards a lateral current flow of holes. Also, SCR structure 430 of FIG. 11 is easier to latch, because it reduces the spacing between cathode 62 and anode 58. Moreover, SCR structure 430 achieves a higher maximum current than SCR structure 400 of FIG. 10, because a flow of current through transistor 110 is not primarily concentrated through a small channel. Since the current path between $V_{cc}$ 74 and P semiconductor layer 432 includes a resistance through N well 434, a higher maximum current discharge level is achieved relative to SCR structure 400 of FIG. 10.

Although the present invention and its advantages have been described in detail, it should be understood that various changes, substitutions and alterations can be made herein without departing from the spirit and scope of the invention as defined by the appended claims.

What is claimed is:

1. A silicon controlled rectifier structure for electrostatic discharge protection, comprising:
    a lightly doped semiconductor layer having a first conductivity type and a face;
    a lightly doped region having a second conductivity type opposite said first conductivity type, formed in said semiconductor layer at said face;
    a first heavily doped region having said second conductivity type, formed laterally within said semiconductor layer at said face and electrically coupled to a first node;
    a second heavily doped region having said second conductivity type, formed laterally within said lightly doped region and electrically coupled to a second node;
    a third heavily doped region having said first conductivity type, formed laterally within said lightly doped region to be interposed between said first and second heavily doped regions and electrically coupled to said second node;
    a gate insulator region formed over adjacent regions of said semiconductor layer and of said lightly doped region to be interposed between said first and third heavily doped regions, such that said gate insulator region is formed over a junction between said semiconductor layer and said lightly doped region; and
    a polysilicon gate layer formed over said gate insulator region and electrically coupled to said first node.

2. The structure of claim 1 and further comprising a field insulator region formed in said lightly doped region to be interposed between said gate insulator region and said third heavily doped region.

3. The structure of claim 2, wherein said polysilicon gate layer extends over substantially all of said gate insulator region and over a portion of said field insulator region.

4. The structure of claim 1 and further comprising a field insulator region formed in said semiconductor layer to be interposed between said gate insulator region and said first heavily doped region.

5. The structure of claim 4, wherein said polysilicon gate layer extends over substantially all of said gate insulator region and over a portion of said field insulator region.

6. The structure of claim 1 and further comprising a field insulator region formed in said lightly doped region to be interposed between said second and third heavily doped regions.

7. The structure of claim 1 wherein said first heavily doped region forms an emitter of an npn bipolar transistor, wherein said semiconductor layer forms a base of said npn bipolar transistor, and wherein said lightly doped region forms a collector of said npn bipolar transistor.

8. The structure of claim 7 wherein an inherent resistance of said semiconductor layer forms a resistance between said base and said emitter of said npn bipolar transistor.

9. The structure of claim 1 wherein said semiconductor layer forms a collector of a pnp bipolar transistor, wherein said lightly doped region forms a base of said pnp bipolar transistor, and wherein said third heavily doped region forms an emitter of said pnp bipolar transistor.

10. The structure of claim 9 wherein an inherent resistance of said lightly doped region forms a resistance between said base and said emitter of said pnp bipolar transistor.

11. The structure of claim 1 wherein said first conductivity type is P and said second conductivity type is N.

12. The structure of claim 1 wherein said first node is coupled to a voltage reference node of an electronic circuit.

13. The structure of claim 12 wherein said second node is coupled to an output signal line of an electronic circuit.

14. The structure of claim 13 wherein said structure is operable to initiate a flow of current between said first and second nodes responsive to said second node reaching a threshold voltage relative to said first node, such that a current through said electronic circuit is reduced to avoid damaging said electronic circuit.

15. The structure of claim 14 wherein said output signal line is coupled through a resistance to a source/drain of a field effect output transistor of said electronic circuit, such that said structure is operable to initiate a flow of current between said first and second nodes responsive to said threshold voltage being reached by a voltage across said resistance together with a voltage between said source/drain and said voltage reference node.

16. The structure of claim 12 wherein said second node is coupled to an input signal line of an electronic circuit.

17. A silicon controlled rectifier structure for electrostatic discharge protection, comprising:
- a lightly doped semiconductor layer having a first conductivity type and a face;
- a lightly doped region having a second conductivity type opposite said first conductivity type, formed in said semiconductor layer at said face;
- a first heavily doped region having said second conductivity type, formed laterally within said semiconductor layer at said face and electrically coupled to a first node, wherein said first node is coupled to a first voltage node of an electronic circuit;
- a second heavily doped region having said second conductivity type, formed laterally within said lightly doped region and electrically coupled to a second node, wherein said second node is coupled to a second voltage node of said electronic circuit; and
- a third heavily doped region having said first conductivity type, formed laterally within said lightly doped region to be interposed between said first and second heavily doped regions and electrically coupled to a third node, wherein said third node is coupled to a signal line of said electronic circuit.

18. The structure of claim 17 and further comprising a field insulator region formed in adjacent regions of said semiconductor layer and of said lightly doped region to be interposed between said first and third heavily doped regions, such that said field insulator region is formed over a junction between said semiconductor layer and said lightly doped region.

19. The structure of claim 17 and further comprising a field insulator region formed in said lightly doped region to be interposed between said second and third heavily doped regions.

20. The structure of claim 17 wherein said first heavily doped region forms an emitter of an npn bipolar transistor, wherein said semiconductor layer forms a base of said npn bipolar transistor, and wherein said lightly doped region forms a collector of said npn bipolar transistor.

21. The structure of claim 20 wherein an inherent resistance of said semiconductor layer forms a resistance between said base and said emitter of said npn bipolar transistor.

22. The structure of claim 17 wherein said semiconductor layer forms a collector of a pnp bipolar transistor, wherein said lightly doped region forms a base of said pnp bipolar transistor, and wherein said third heavily doped region forms an emitter of said pnp bipolar transistor.

23. The structure of claim 22 wherein an inherent resistance of said lightly doped region forms a resistance between said base and said emitter of said pnp bipolar transistor.

24. The structure of claim 17 wherein said first conductivity type is P and said second conductivity type is N.

25. The structure of claim 17 wherein said structure is operable to initiate a flow of current between said first and third nodes responsive to said third node reaching a threshold voltage relative to said second node, such that a current through said electronic circuit is reduced to avoid damaging said electronic circuit.

26. The structure of claim 25 wherein said semiconductor layer forms a collector of a pnp bipolar transistor, wherein said lightly doped region forms a base of said pnp bipolar transistor, wherein third heavily doped region forms an emitter of said pnp bipolar transistor, and wherein said threshold voltage is substantially equal to a voltage between said base and said emitter for substantially turning on said pnp bipolar transistor.

27. The structure of claim 17 wherein said signal line is an output signal line of said electronic circuit.

28. The structure of claim 17 wherein said signal line is an input signal line of said electronic circuit.

29. The structure of claim 17 wherein said first voltage node is a voltage reference node of said electronic circuit.

30. The structure of claim 17 wherein said second voltage node is a voltage supply node of said electronic circuit.

* * * * *